United States Patent
Shang et al.

(10) Patent No.: US 6,172,322 B1
(45) Date of Patent: *Jan. 9, 2001

(54) ANNEALING AN AMORPHOUS FILM USING MICROWAVE ENERGY

(75) Inventors: Quanyuan Shang, San Jose; Robert McCormick Robertson, Santa Clara; Kam S. Law, Union City; Takako Takehara, Hayward; Taekyung Won, Santa Clara; Sheng Sun, San Jose, all of CA (US)

(73) Assignee: Applied Technology, Inc., Tokyo (JP)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/965,939

(22) Filed: Nov. 7, 1997

(51) Int. Cl.$^7$ ............................... H05B 6/80; C23C 16/00

(52) U.S. Cl. ............... 219/121.43; 219/746; 219/686; 219/761; 118/723 MW; 156/345

(58) Field of Search ..................... 219/746, 762, 219/679, 678, 121.43, 686, 761; 118/723 MW; 156/345

(56) References Cited

U.S. PATENT DOCUMENTS

| | | | |
|---|---|---|---|
| 4,366,208 | * 12/1982 | Akai et al. | 427/41 |
| 4,957,591 | * 9/1990 | Sato et al. | 156/643 |
| 5,030,475 | * 7/1991 | Ackermann et al. | 427/39 |
| 5,037,666 | * 8/1991 | Mori | 427/45.1 |
| 5,133,825 | * 7/1992 | Hakamata et al. | 156/345 |
| 5,273,609 | * 12/1993 | Moslehi | 156/345 |
| 5,803,974 | * 9/1998 | Mikoshiba et al. | 118/723 MP |

FOREIGN PATENT DOCUMENTS

| | | | |
|---|---|---|---|
| 52-14370 | * 2/1977 | (JP) | 219/762 |
| 63-14119 | 5/1988 | (JP) | H01L/21/05 |
| 2-170530 | * 7/1990 | (JP) . | |

OTHER PUBLICATIONS

Ford and Conner, Status of Low Temperature Polysilicon TFT LCD Technology Development, *InterLingua, Display Search*, Mar. 1997.

Andreas Ohl, Large Area Planar Microwave Plasmas, *Microwave Discharges: Fundamentals and Applications*, pp. 205–213, 1993.

M. Okabe, Low–temperature Poly–Si TFT–LCDs with Monolithic Drivers, *AM–LCD '96/IDW '96*, pp. 5–8.

Colagan, et al., Copper–Gate Process for High Information Content a–Si TFT–LCDs, *AM–LCD '96/IDS '96*, pp. 29–32.

Chen, et al., Electrical Performance and Instability of High Field–effect Mobility a–Si:H TFTs Made from High Deposition–Rate PECVD Materials, *AM–LCD '96/IDA '96*, pp. TFT 2–3 (37–40).

(List continued on next page.)

*Primary Examiner*—Philip H. Leung
(74) *Attorney, Agent, or Firm*—Birgit E. Morris

(57) ABSTRACT

A system and method for annealing a film on a substrate in a processing chamber, including a microwave generator disposed to provide microwaves to an area within the interior of the chamber. The microwaves have a frequency such that the film is substantially absorptive at the frequency but the substrate is not substantially absorptive at the frequency. A waveguide distributes the microwaves over the surface of the film to provide a substantially uniform dosage of microwaves over the surface of the film. The method includes depositing a film on a substrate in the processing chamber. During at least a portion of the time of the depositing step, microwaves are generated having a frequency such that the film has an absorption peak at the frequency but the substrate lacks a substantial absorption peak at the frequency. The microwaves are directed towards the film.

3 Claims, 2 Drawing Sheets

OTHER PUBLICATIONS

Ando, et al., Effects of back–channel etching on the performance of a–Si:H thin–film transistors, *AM–LCD '96/IDS '96*, pp. TFT2–5.

Takechi, et al., An application of 40MHz Discharge for SiNx Film Deposition to a–Si:H TFT Fabrication, *AM–LCD '96/IDS '96*, pp. TFTp2–1.

Xu, et al., A Novel Thin–Film Transistors with $\mu$c–Si/a–Si Dual Active Layer Structure for AM–LCD, *AM–LCD '96/IDS '96*, pp. TFTp2–5.

Fukumoto, et al., A 14.5–Inch–Diagonal XGA In–Plane–Switching Mode LCD Addressed by Metal–Source/Drain Top–Gate a–Si TFT, *AM–LCD '96/IDS '96*, pp. LCD 2–3.

Shinjou, et al., A High Aperture Ratio 11.3 inch–diagonal SVGA TFT–LCDs Fabricated by Reduced Process Method, *AM–LCD '96/IDS '96*, pp. LCD3–1.

Hiroshi Take, New Development of Large Size an High Resolution TFT–LCDs, *AM–LCD '96/IDS '96*, pp. LCD–5–1.

* cited by examiner

ANNEALING AN AMORPHOUS FILM USING MICROWAVE ENERGY

FIELD OF THE INVENTION

The present invention relates generally to a method and an apparatus for annealing amorphous films, and more particularly to a method which may be used to anneal amorphous silicon films ("a-Si") so that they are transformed into polysilicon films ("p-Si"). The method uses microwave energy to perform the heating for the anneal.

BACKGROUND OF THE INVENTION

Plasma-assisted chemical reactions, such as plasma-enhanced chemical vapor deposition ("PECVD"), have been widely used for film deposition in the semiconductor and flat panel display industries in the manufacture of thin film transistors ("TFT"s) for active-matrix liquid crystal displays ("AMLCD"s), e.g. In accordance with PECVD, a substrate is placed in a vacuum deposition chamber that is equipped with a pair of parallel plate electrodes. One of the electrodes, e.g., the lower electrode, generally referred to as a susceptor, holds the substrate. The other electrode, e.g., the upper electrode, functions as a gas inlet manifold or shower head. During deposition, a reactant gas flows into the chamber through the upper electrode and a radio frequency (RF) voltage is applied between the electrodes to produce a plasma within the reactant gas. The plasma causes the reactant gas to decompose and deposit a layer of material onto the surface of the substrate.

Two types of materials often deposited are p-Si and a-Si. Both a-Si and p-Si are used to fabricate TFTs, such as those used in AMLCDs. Other applications include solar cells, etc. Typically, p-Si is deposited from a silane source at a substrate temperature above about 600 degrees Celsius (° C.). If the substrate temperature is lower, the initially deposited structure is a-Si; i.e., it has no definite arrangement of atoms.

Thus, it is often easier to deposit a-Si because less substrate heating is required. However, devices made with a-Si often exhibit poorer performance when compared to the same devices made with p-Si. E.g., field effect mobility, which is generally accepted to be one of the most important device characteristics, may be better for p-Si than for a-Si by orders-of-magnitude. Thus, using p-Si films instead of a-Si films may increase the performance of devices such as flat panel displays. Fortunately, a p-Si film may be obtained from an a-Si film by annealing the a-Si film.

Annealing, however, may be difficult in some cases. One reason for this concerns the quality of the substrate used. For a commercially-viable application of flat panel displays, e.g., the glass substrates used should be inexpensive. However, the maximum processing and deposition temperature of an inexpensive glass substrate may be relatively low, e.g., below 400° C. At these temperatures, only a-Si can be deposited.

Current annealing methods encounter difficulties with such substrates. These techniques heat the substrate and the film at the same time, and thus are problematic for the reason noted above.

Conventional methods of performing annealing include, among others, laser annealing, thermal annealing, and lamp annealing. These approaches have certain inherent drawbacks. Laser annealing requires a complicated scanning laser configuration. Thermal annealing requires, e.g., a source of hot gas in addition to the gas sources already required for deposition. Lamp annealing requires a complicated multiple-lamp system to ensure temperature uniformity.

SUMMARY OF THE INVENTION

In one aspect, the invention is directed to a system for annealing a film on a substrate in a processing chamber, including a microwave generator disposed to provide microwaves to an area within the interior of the chamber. The microwaves have a frequency in a range such that the film is substantially absorptive at some frequency within the range but the substrate is not substantially absorptive at the frequencies in the range. A waveguide distributes the microwaves over the surface of the film to provide a substantially uniform dosage of microwaves over the surface of the film.

Implementations of the invention may include one or more of the following. The substrate may be glass and the film amorphous silicon. The microwave frequency may be about 2.45 GHz.

In another aspect, the invention is directed to a method of annealing a film in a processing chamber. The method includes depositing a film on a substrate in the processing chamber. During at least a portion of the time of the depositing step, microwaves are generated having a predetermined frequency. The film has an absorption peak at or near the predetermined frequency but the substrate lacks a substantial absorption peak at or near the frequency. The microwaves are directed towards the film.

Implementations of the invention may include one or more of the following. The deposition step may include the step of forming a silane plasma within the processing chamber.

In another aspect, the invention is directed to a method of annealing an amorphous film of silicon in a thermochemical processing chamber to form a film of polysilicon. An amorphous silicon film is deposited on a glass substrate in the processing chamber. Microwaves are generated having a frequency such that the amorphous silicon film is substantially absorptive at or near the frequency but the glass is not substantially absorptive at or near the frequency. The microwaves are guided to the surface of the amorphous silicon film such that the amorphous silicon film is transformed into a polysilicon film.

In another aspect, the invention is directed to a method similar to the above. A further step includes heating the film for a predetermined time period using the microwaves.

In another aspect, the invention is directed to a method of annealing a film in a processing chamber. In this method, a film is provided on a substrate in the processing chamber, and a gas is provided in the processing chamber. Microwaves are generated having a frequency such that the microwaves induce a plasma of at least a portion of the gas. The microwave-induced plasma has a substantial thermal energy transfer to the film.

In another aspect, the invention is directed to a method of depositing and annealing a film in a processing chamber. A substrate is provided in the processing chamber. A gas is flowed into the processing chamber. Microwaves are generated having a such that a portion of the microwaves induce a plasma of at least a portion of the gas. A film is deposited on the substrate from the plasma. The microwaves are directed to the surface of the film, the microwaves having a frequency such that the film is substantially absorptive at or near the frequency but the substrate is not substantially absorptive at or near the frequency.

Advantages of the invention include the following. The invention achieves an anneal of a-Si films, transforming a-Si films into p-Si films, without the complexity of, e.g., laser annealing, thermal annealing, or lamp annealing systems.

The invention also achieves a higher quality anneal by not heating the substrate during the anneal, instead only heating the deposited film. In this way, lesser quality substrates may be accommodated if necessary. Finally, the system of the invention may be easily scaled for large or small substrates.

Other features and advantages of the invention will be apparent from the following description, including the drawing and the claims.

DETAILED DESCRIPTION

The present invention is directed to a method for annealing deposited films. In the implementation described, the invention is used in a PECVD chamber. Pertinent details of such chambers are described below following the description of the method. Certain of the details are specific to this implementation and may be changed as required by the processing conditions and parameters.

Figure 1:
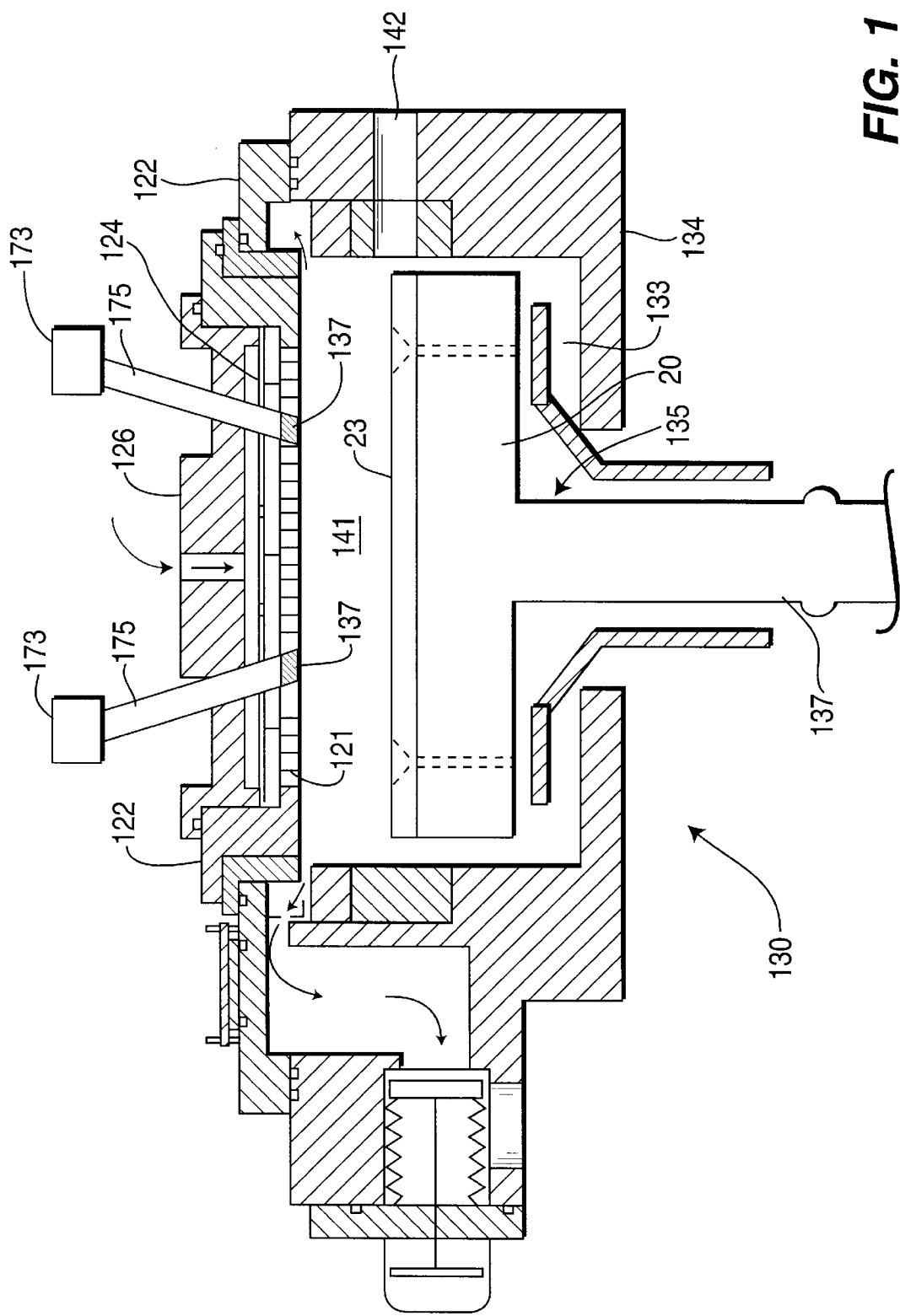
FIG. 1 is a cross-sectional view of a PECVD processing chamber employing a microwave annealing system.

Referring to FIG. 1, a PECVD apparatus 130 includes a susceptor 135, having a substrate support plate 20 mounted on a stem 137. The susceptor is centered within a vacuum deposition process chamber 133. A surface 23 of support plate 20 supports a substrate such as a glass panel (not shown) in a substrate processing or reaction region 141. Substrates are transferred into and out of chamber 133 through an opening 142 in a sidewall 134 of chamber 133 by a robot blade (not shown).

The process gases (indicated by arrow 123) flow into chamber 133 through an inlet manifold 126. The gases then flow through a perforated blocker plate 124 and holes 121 in a process gas distribution faceplate 122. Small arrows in the substrate processing region 141 of FIG. 1 indicate this gas flow.

An RF power supply (not shown) may be used to apply electrical power between gas distribution faceplate 122 and susceptor 135 so as to excite the process gas mixture to form a plasma. At the same time, the substrate is supported in the vacuum deposition process chamber and may be heated to several hundred degrees Celsius. The constituents of the plasma react to deposit a desired film on the surface of the substrate on support plate 20.

A processing step discussed here is the deposition of silicon. Silicon may be deposited using decomposition of silane ($SiH_4$):

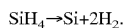

$SiH_4 \rightarrow Si + 2H_2$.

In a first embodiment, a post-deposition anneal increases the film uniformity by further crystallizing the film using microwave energy.

A microwave generator 173 forms microwaves, which are directed towards the surface of the a-Si film. The microwaves are directed via waveguides 175 through sapphire windows 137 such that each part of the film surface area receives an approximately equal "dosage" of microwaves.

Microwave generator 173 may be an "off-the-shelf" microwave generator. Alternatively, such a generator may be modified to achieve the features described.

Microwave generators may also be used which have an exceptionally wide beam so as to ensure a uniform microwave illumination over the entirety of the film. E.g., microwave beam sources have been developed which can produce a beam having an area of one square meter or even larger. One way of creating a large area planar microwave distribution is described in "Large Area Planar Microwave Plasmas", Microwave Discharges: Fundamentals and Applications, edited by C. M. Ferreira and M. Moisan, pages 205–213, (Plenum Press, N.Y. 1993), incorporated herein by reference.

The microwave energy may be directed by an appropriate design of a microwave waveguide 175 as is known in the art. Alternatively, a number of waveguides may be employed in order to achieve a uniform dosage. If only one microwave waveguide is employed, a scanning or dispersing system may be used to distribute the microwaves in a uniform manner over the extent of the substrate.

The range of microwave frequencies emitted by the microwave generator is chosen such that the film, e.g., a-Si, is strongly absorptive. The range of microwave frequencies chosen may also be such that the substrate is not strongly absorptive. E.g., a frequency of 2.45 GHz may be used.

Microwaves from waveguide 175 may enter into processing region 141 through a sapphire window 137. The microwaves are incident on the film on substrate 165. Substrate 165 may rest on substrate support plate 20 (see FIG. 1) or alternatively on glass supports 171.

The above anneal heats the film but much less so the glass substrate. The film is heated and is made to recrystallize to form a high quality film of p-Si. Since the substrate glass is not substantially heated, bubbling and peeling of the film from the substrate is substantially eliminated.

Figure 2:
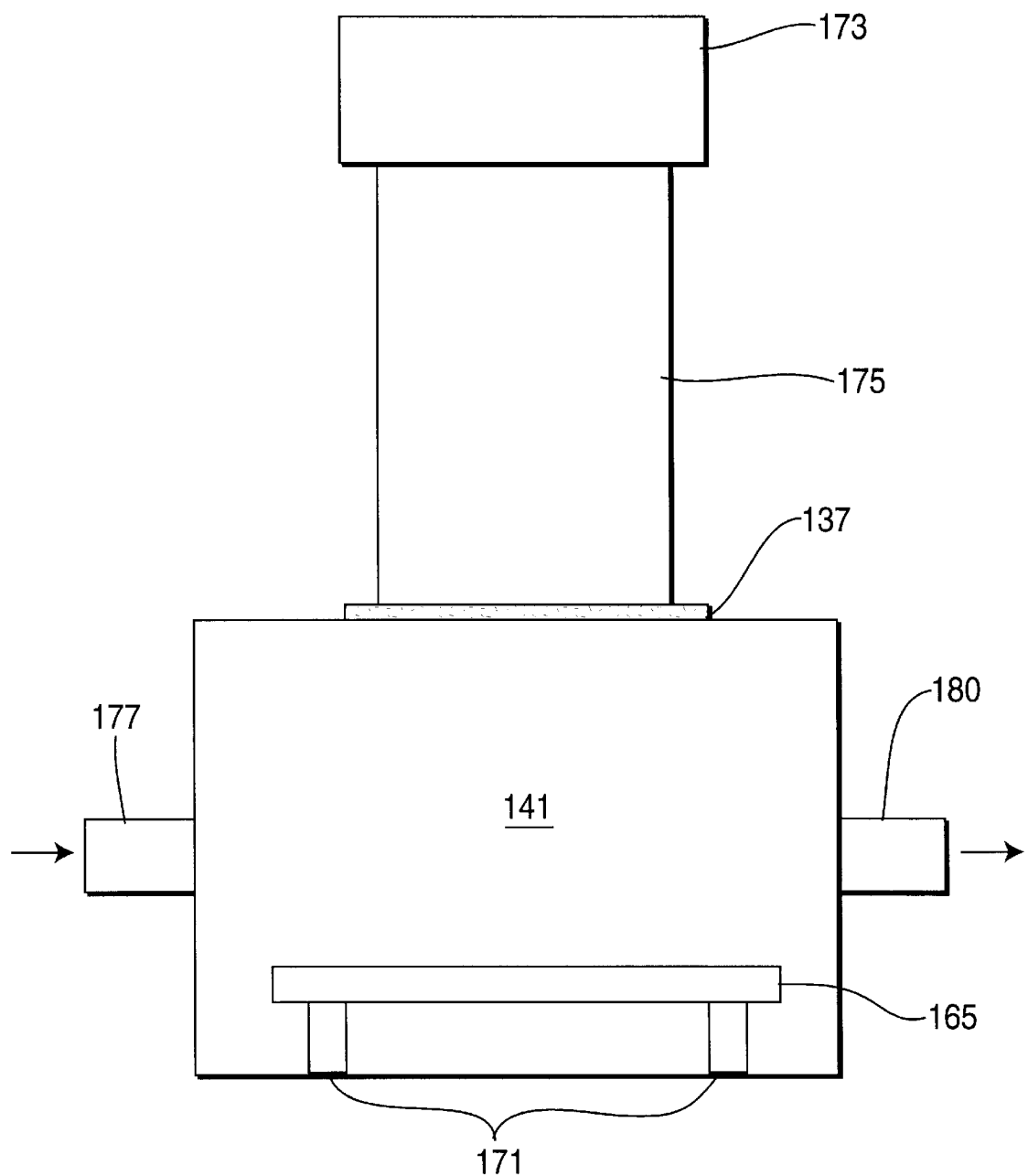
FIG. 2 is a schematic view of a chamber employing a microwave generator and waveguide used in the annealing of films according to an embodiment of the present invention.

In a second embodiment, which may also be described by FIG. 2, the microwave energy does not directly necessarily transfer energy to the film. Rather, the microwave energy is used to generate a plasma, which can efficiently transfer thermal energy to the film, thereby heating the film. In this embodiment, the frequency and energy of the microwaves are not necessarily chosen to match a significant absorption band in the film. Rather, the resulting "microwave-assisted" plasma is chosen for its energy transfer capabilities to the film. In particular, the plasma should be highly efficient in transferring energy to the film, which results in a temperature rise of the film. In other words, the plasma heats the film. No deposition generally occurs from the plasma in this embodiment.

A benefit of this embodiment is that these so-called "microwave-assisted" plasmas result in less ion-induced damage to the film. One reason for the reduced damage is that the ions generated are less energetic than the ions generated by the more typical RF plasma.

A further benefit of this embodiment results if the gas used is hydrogen. Use of a hydrogen plasma can result in a beneficial and desirable "passivation" effect of the annealed p-Si film. Such a passivation effect can make the film surface less susceptible to damage or contamination. Other gases, which may be used, include nitrogen or ammonia, but may generally include any gas that is inert to amorphous silicon. Referring to FIG. 2, the gas may be injected via an inlet port 177 and exhausted via an exhaust port 180.

In the above first and second embodiments, the film may be annealed in either of two locations or chambers. First, the film may be annealed in the same deposition chamber in which the film was formed. Such an anneal may be described by the embodiment of FIG. 1. Second, the film may be annealed in a separate microwave annealing chamber. This anneal may be described by the embodiment of FIG. 2.

In a third embodiment, the microwave energy performs two functions. It generates a plasma of the deposition gases, which in this case may include silane. In other words, the microwave generator takes the place of the RF voltage source and a set of electrodes inside the chamber. Thus, the system in this embodiment would appear like that of FIG. 1 but would lack an RF generator.

The microwaves also anneal the film. In other words, the microwave generator emits energy which is absorbed by the film to increase the film temperature, causing an anneal.

Therefore, in this embodiment, the a-Si film is deposited on the surface of the substrate and is annealed at substantially the same time. This dual functionality places requirements on the microwave generator. The frequency and energy of the microwaves must be appropriate for both plasma generation and for a-Si heating.

EXAMPLE

An example procedure was run illustrating one way of performing the second embodiment of the invention. This example, of course, should not be construed as limiting but rather merely illustrative. The experimental apparatus appeared roughly like the apparatus of FIG. 2.

The film to be annealed was 2000 angstroms of a-Si and was deposited on a glass substrate made of Corning 1739 having a thickness of 1.1 mm. A gas of ammonia was flowed into the chamber to a pressure of about 3 Torr. Microwaves having a frequency of 2.45 GHz and a power of 3 kW were used to excite the gas into a plasma. After about 5 seconds, the film was appropriately annealed from a-Si to p-Si. In general, this time could be on the order of a second to several tens of seconds or even minutes, depending on the film to be annealed.

To optimize the procedure for other films, one may vary the gas types, the pressure of gas, the microwave power, and the time of annealing. Of course, it is desirable that the film not be heated so much that the glass or other substrate, on which the film is deposited, melt. Given the short time of annealing demonstrated above, this requirement may be conveniently met. E.g., a temperature of at least 1450° C. is required to melt and anneal a-Si to p-Si. At this temperature, the glass would melt (its melting point being between 400° C. and 600° C., depending on the type of glass). Given the preferential heating of the film rather than the glass, and the short time period achieved by these embodiments employing the invention, the film may be effectively annealed without deleteriously affecting the glass.

After the anneal is performed by any of the three embodiments, the film may be further processed. Such further processing may involve the growth or deposition of other films on the p-Si as may be required for the fabrication of a device such as a TFT. Such processing may involve reinstatement of a plasma for use in deposition or other processes, and this plasma may be of an inert gas or otherwise.

Chambers in which the method of the invention may be implemented include the following features. The chamber should allow for heating and/or preheating of the substrate. Preheating may be employed to reduce the amount of microwave energy required. The chamber should be capable of allowing the annealing process to be carried out in various environments including air, vacuum, or a predetermined gas environment so as to maintain a predetermined pressure.

The present invention may be implemented, e.g., in a model AKT-3500 PECVD System, manufactured by Applied Komatsu Technology of Santa Clara, Calif. The AKT-3500 PECVD system is designed for use in the production of substrates for large liquid crystal flat panel displays. It is a modular system with multiple process chambers, which can be used for depositing amorphous silicon, silicon nitrides, silicon oxides, oxynitride films, and other similar films. More details regarding the system may be found in U.S. patent application Ser. No. 08/707,491, entitled "A Deposition Chamber Cleaning Technique Using a High Power Remote Excitation Source", filed Sep. 16, 1996, assigned to the assignee of the present invention and incorporated herein by reference.

This detailed description has described an embodiment in which a glass substrate is used. The term "substrate" is intended to broadly cover any object that is being processed in a process chamber, including flat panel displays, glass or ceramic plates, or disks. The present invention is particularly applicable to large substrates such as glass plates having dimensions of 360×450 mm, 550×650 mm, and even larger.

While the present invention has been described with reference to specific embodiments, the scope of the invention is defined by the appended claims.

What is claimed is:

1. A system for annealing a film on a substrate in a vacuum processing chamber comprising a plasma enhanced chemical vapor deposition chamber having a substrate support centered in the chamber, a sidewall opening in the chamber for ingress and egress of a substrate to be processed in the chamber while mounted on the substrate support;

a gas inlet manifold having a plurality of openings for the passage of processing gas into the chamber mounted opposed to and spaced from the substrate support;

an RF power supply connected to said chamber to form a plasma therein from said processing gas to deposit a film on said substrate;

a plurality of microwave generators mounted above said chamber, each connected to a waveguide mounted so as to direct microwaves uniformly over the surface of said film through a plurality of windows in said chamber, said microwaves having a frequency that is absorbed by said film and that is not absorbed by said substrate.

2. The system of claim 1, wherein the frequency is about 2.45 GHz.

3. A system according to claim 1 wherein said microwaves generate a plasma in the chamber that transfers energy to said film, thereby heating said film to anneal temperatures.

* * * * *